United States Patent
Chung et al.

(10) Patent No.: US 7,105,099 B2
(45) Date of Patent: Sep. 12, 2006

(54) METHOD OF REDUCING PATTERN PITCH IN INTEGRATED CIRCUITS

(75) Inventors: Henry Chung, Taipei (TW); Ming-Chung Liang, Hsinchu (TW); An-Chi Wei, Hsinchu (TW); Shin-Yi Tsai, Kaohsiung (TW); Kuo-Liang Wei, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 84 days.

(21) Appl. No.: 10/710,488

(22) Filed: Jul. 14, 2004

(65) Prior Publication Data

US 2006/0011575 A1    Jan. 19, 2006

(51) Int. Cl.
*B44C 1/22* (2006.01)
*H01L 21/00* (2006.01)

(52) U.S. Cl. ............... 216/41; 216/47; 216/74; 216/79; 438/689; 438/947; 430/311; 430/313

(58) Field of Classification Search ............... 216/41, 216/47, 74, 79; 438/689, 947; 430/311, 430/313
See application file for complete search history.

(56) References Cited

U.S. PATENT DOCUMENTS

| 6,475,922 B1 * | 11/2002 | Zheng | 438/725 |
| 6,878,646 B1 * | 4/2005 | Tsai et al. | 438/756 |
| 2003/0222287 A1 * | 12/2003 | Tamura | 257/213 |

* cited by examiner

*Primary Examiner*—Shamim Ahmed
(74) *Attorney, Agent, or Firm*—Jiang Chyun IP Office

(57) ABSTRACT

A method of reducing pattern pitch is provided. A material layer, a hard mask layer and a patterned photoresist layer are sequentially formed over a substrate. Using the patterned photoresist layer as etching mask, the hard mask layer is etched. Due to the trenching effect, a residual hard mask layer remains in an exposed region exposed by the photoresist layer and micro-trenches are formed at the edges of the residual hard mask layer. Thereafter, using the residual hard mask layer as etching mask to pattern the material layer. Finally, the patterned photoresist layer and the hard mask layer are removed. In the invention, the trenching effect is utilized when etching the hard mask layer. A portion of the hard mask layer remains, and the micro-trenches are formed in the hard mask layer. After the micro-trenches are transferred to the material layer, the pattern pitch can be reduced.

22 Claims, 3 Drawing Sheets

METHOD OF REDUCING PATTERN PITCH IN INTEGRATED CIRCUITS

BACKGROUND OF INVENTION

1. Field of the Invention

The present invention relates to a semiconductor fabrication process. More particularly, the present invention relates to a method of reducing pattern pitch.

2. Description of the Related Art

As the level of integration of integrated circuits continues to increase, the size of each semiconductor device and the distance between the devices in integrated circuits must be reduced. In other words, the minimum pattern pitch, the sum of pattern line-width and the space in an integrated circuit, must be as fine as possible. At present, the minimization of pattern pitch in integrated circuit fabrication is primarily driven by getting a finer photolithographic resolution. However, advances in photographic resolution have become increasingly challenging and costly due to intrinsic optical limitations, increasingly challenging and costly due to intrinsic optical limitations. The 248-nm lithography, coupled with other resolution enhancement techniques, cannot be extended far beyond the 100-nm process technology node. The 193-nm lithography, cannot be extended far beyond the 70-nm technology node. The skyrocketing cost of photo-mask and resist for the 193-nm lithography further limits its wide applications. Further reduction in the minimum pitch in integrated circuits is thus more difficult after reaching certain photographic resolution limit. Without further reduction in pattern pitch, increasing the device packing-density and the level of integration of integrated circuits is virtually impossible. Alternative cost-effective approaches are desired.

SUMMARY OF INVENTION

Accordingly, one objective of the present invention is to provide a method of reducing pattern pitch in integrated circuits.

A second objective of this invention is to provide a method of reducing pattern pitch in integrated circuits so that the device packing density in an integrated circuit can be increased.

To achieve these and other advantages and in accordance with the purpose of the invention, as embodied and broadly described herein, the invention provides a method of reducing pattern pitch. A material layer, a hard mask layer and a patterned photoresist layer are sequentially formed over a substrate. Using the patterned photoresist layer as etching mask, the hard mask layer is etched. Due to the trenching effect, a portion of the hard mask layer remains in an exposed region, which is not covered by photoresist and micro-trenches are formed at the edges of the exposed region. Thereafter, using the residual hard mask layer as etching mask, the material layer is patterned. Finally, the patterned photoresist layer and the hard mask layer are removed. In the invention, the trenching effect is utilized when etching the hard mask layer. A portion of the hard mask layer remains, and the micro-trenches are formed in the hard mask layer. The micro-trenches are transferred to the material layer subsequently in patterning the material layer, and the pattern pitch is made finer than the pitch of patterned photoresist layer.

This invention also provides a method of forming a patterned mask for reducing pattern pitch. A mask layer is formed over a substrate. A patterned photoresist layer is formed over the mask layer. Thereafter, using the patterned photoresist layer as etching mask, the mask layer is etched. Utilizing the trenching effect in plasma etching, a portion of the mask layer remains in an exposed region and micro-trenches are formed at the edges of the exposed region. The patterned photoresist layer is removed subsequently.

This invention also provides a method of reducing pattern pitch. A material layer is formed over a substrate. A patterned mask layer is formed on the material layer. Then, an etching process such as an ion reactive etching process using the patterned mask layer as etching mask is performed to form micro-trenches in the material layer, wherein the micro-trenches are formed in the material layer along the sidewalls of the patterned mask layer. The patterned mask layer is removed subsequently.

In this invention, the conventionally undesired trenching effect is utilized when etching the mask layer. As a result of the trenching effect, a portion of the mask layer remains within the exposed region, and micro-trenches are formed at the edges of the exposed region so that pattern pitch can be reduced.

In this invention, the reactive ion etching process with specific recipes are utilized to etch the material layer. The reactive ions etch the material layer along sidewalls of the patterned mask layer to form micro-trenches in the material layer and reaching in the reduction of pattern pitch.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
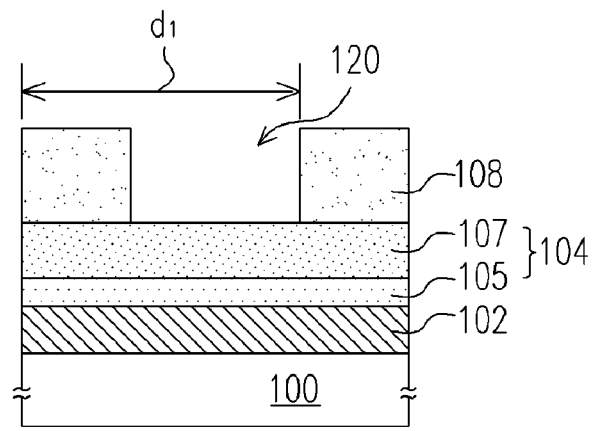
FIGS. 1A to 1E are schematic cross-sections showing the steps in a manufacturing process capable of reducing pattern pitch according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1E are schematic cross-sections showing the steps in a manufacturing process capable of reducing pattern pitch according to one preferred embodiment of this invention. As shown in FIG. 1A, a material layer 102, a hard mask layer 104 and a patterned photoresist layer 108 are sequentially formed over a substrate 100. The material layer 102 is comprised of, for example, a conductive layer or an insulating layer or a dielectric layer. The hard mask layer 104 is formed, for example, by depositing a mask material over the material layer 102 to form a thin mask layer 105 and then depositing another mask material over the thin mask layer 105 to form a thick mask layer 107. A region exposed by the patterned photoresist layer is defined as an exposed region 120.

The etching selectivity of the hard mask layer 107 to the thin mask layer 105 needs be greater than 1. The etching selectivity of the material layer 102 to the thin mask layer 105 needs be as high as possible, for example, greater than 10. This is because the thick mask layer 107 will be etched first, and then the thin mask layer 105 will be patterned using the etched thick mask layer 107 as etching mask. Therefore, the etching selectivity of the hard mask layer 107 to the thin mask layer 105 should be greater than 1. In addition, if the etching selectivity of the material layer 102 to the thin mask layer 105 is high enough, the thin mask layer 105 can be made thinner and helps in better defining the material layer 102. In a preferred embodiment, the thin mask layer 105 is comprised of, for example, silicon oxide. The thick mask layer 107 is comprised of, for example, a silicon nitride layer.

Conventionally, the trenching effect is undesired while patterning the mask layer 104. Pattern pitch of the material layer is determined by the opening in the photoresist layer 108, and it is limited by the lithographic resolution limit. The conventional pattern pitch is d which is a width of a line width and a space as shown in FIG. 1A. However, in the present invention, the trenching effect is utilized to achieve the objective of the invention, as shown in FIG. 1B.

Figure 1B:
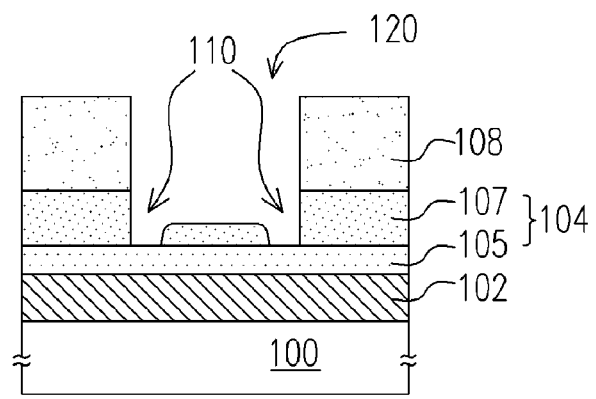

In FIG. 1B, using the patterned photoresist layer 108 as etching mask, the hard mask layer 104 is etched. Due to the trenching effect, a portion of the hard mask layer 104 remains in the exposed region 120, and micro-trenches 110 are formed at the edges of the exposed region 120. When the hard mask layer 104 consists of the thin mask layer 105 and the thick mask layer 107, the thick mask layer 107 is etched first. Because of the trenching effect, a portion of the thick mask layer 107 remains in the exposed region 120, and micro-trenches 110 are formed in the etched thick mask layer 107.

Figure 1C:
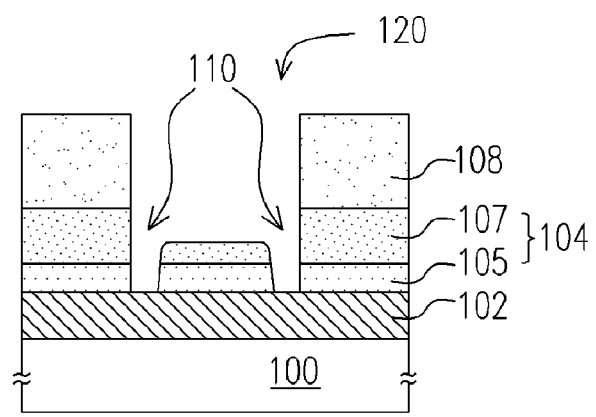

As shown in FIG. 1C, using the patterned photoresist layer 108 and the residual thick mask layer 107 as etching mask, the thin mask layer 105 is patterned to extend the two micro-trenches 110 into the thin mask layer 105 using a conventional plasma etch.

The width of the micro-trenches 110 can be controlled by regulating the etching chemistry. Alternatively, after forming the micro-trenches 110, an additional isotropic etching step can be conducted to regulate the width of the micro-trenches 110.

Figure 1D:
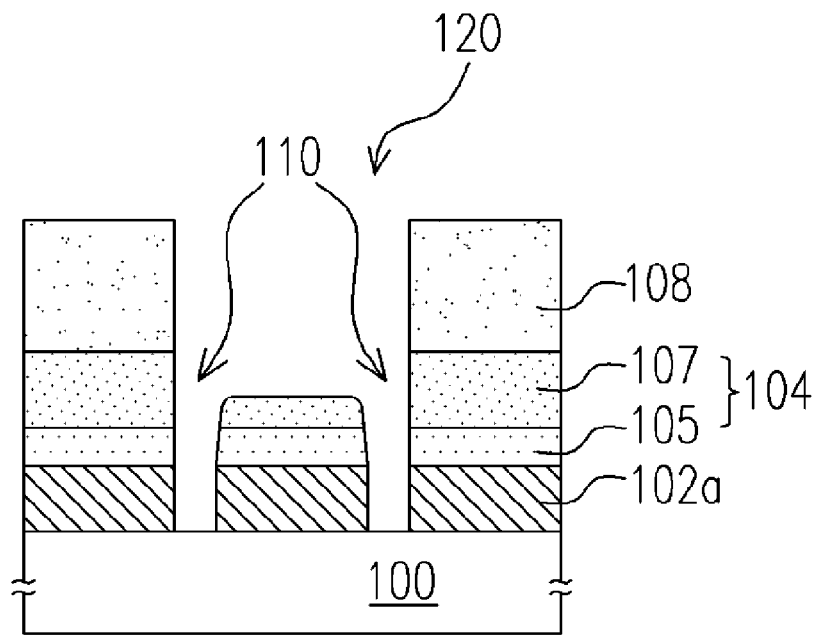

As shown in FIG. 1D, using the residual hard mask layer 104 as etching mask or using the residual photoresist layer 108 and the residual hard mask layer 104 as etching mask, the material layer 102 is patterned. Since the hard mask layer 104 has two micro-trenches 110, the two micro-trenches 110 also extend into the material layer 102. And the patterned material layer 102a is formed.

Figure 1E:
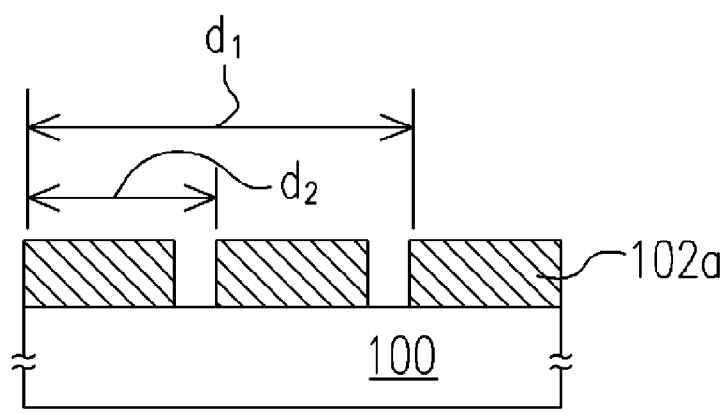

As shown in FIG. 1E, the patterned photoresist layer 108 and the hard mask layer 104 (shown in FIG. 1D) are removed to expose the patterned material layer 102a and a pattern having a pattern pitch $d_2$ of which is substantially smaller than that of $d_1$ the pitch of the patterned photoresist layer. The pattern pitch $d_2$ is about half of the pitch $d_1$ and the width of one space in the patterned photoresist layer 108 (as shown in FIG. 1A) is almost equal to the width of one line of the material layer 102a and two spaces in the material layer 102a. Hence, the method of present invention is capable of achieving a pattern pitch which is significantly finer than the pattern pitch of the patterned photoresist layer.

In summary, one major feature of this invention is that the trenching effect, conventionally undesired, is utilized for forming micro-trenches as substantially described above, and therefore manufacturing of a highly integrated device can be realized.

Figure 2A:
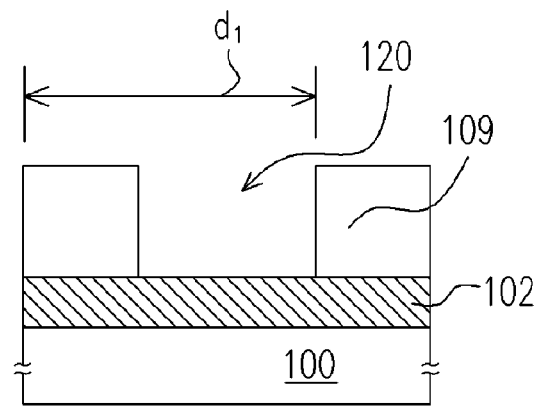
FIGS. 2A to 2C are schematic cross-sections showing the steps in a manufacturing process capable of reducing pattern pitch according to another preferred embodiment of this invention.
Figure 2B:
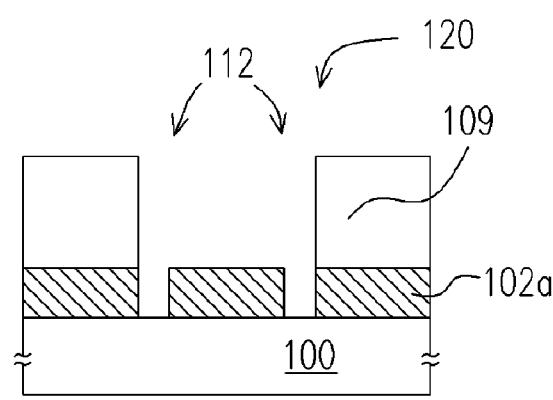
Figure 2C:
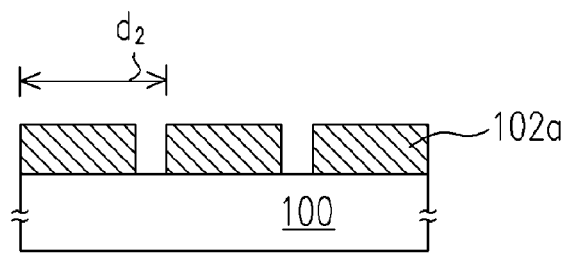

FIGS. 2A to 2C are schematic cross-sections showing the steps in a manufacturing process capable of reducing pattern pitch according to another preferred embodiment of this invention. As shown in FIG. 2A, a material layer 102 is formed over a substrate 100. The material layer 102 is comprised of, for example, a conductive layer or an insulating layer or a dielectric layer. A patterned mask layer 109 is formed on the material layer 102, wherein the patterned mask layer is comprised of, for example, a photoresist layer or a layer with etching rate lower than the material layer 102. Especially, a pattern pitch d1 is the limitation of the lithographic process.

As shown in FIG. 2B, an etching process is performed using the patterned mask layer 109 as etch mask for forming micro-trenches 112 in the material layer 102, wherein the micro-trenches 112 are formed in the material layer 102 along the sidewalls of the patterned mask layer 109. In a preferred embodiment, the etching process is a reactive ion etching (RIE) process, and the pressure of the etching process is higher than 10 mTorrs. In addition, the bias power of the RIE process is lower than 150 W, and the source power of the RIE process is higher than 500 W. The reactive gas used in the RIE process comprises chlorine when the material layer 102 is a polysilicon layer and the patterned mask layer 109 is a silicon oxide layer.

As shown in FIG. 2C, the mask layer 109 is removed to expose the patterned material layer 102a with a pattern pitch d2, wherein the pattern pitch $d_2$ is about half of the pitch $d_1$ and the width of one space in the patterned photoresist layer 109 (as shown in FIG. 2A) is almost equal to the width of one line of the material layer 102a and two spaces in the material layer 102a. Therefore, the method of the present invention is capable of forming a pattern pitch, which is substantially smaller than the minimum pattern pitch which can be achieved by using the most advanced lithographic technology.

In this invention, the reactive ion etching process with specific recipes are utilized to etch the material layer. The reactive ions etch the material layer along sidewalls of the patterned mask layer to form the micro-trenches in the material layer. Therefore, the pattern pitch can be reduced and therefore the device packing density in integrated circuits can be effectively increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of reducing pattern pitch on a substrate, comprising the steps of:

forming a material layer aver the substrate;

forming a hard mask layer over the material layer;

forming a patterned photoresist layer over the hard mask layer to expose a region; etching the hard mask layer using the patterned photoresist layer as etching mask, wherein a residual hard mask layer remains in the exposed region and a plurality of micro-trenches are formed at the edges of the residual hard mask layer in the exposed region;

patterning the material layer using the residual hard mask layer as etching mask; and removing the patterned photoresist layer and the hard mask layer.

2. The method of claim 1, wherein the step of forming the hard mask layer over the material layer includes the sub-steps of:

forming a thin mask layer over the material layer; and forming a thick mask layer over the thin mask layer.

3. The method of claim 2, wherein the step of etching the hard mask layer using the patterned photoresist layer includes the sub-steps of:

etching the thick mask layer using the patterned photoresist layer as etching mask, wherein due to the trenching effect, a residual thick hard mask layer remains in the exposed region and the micro-trenches are formed in the thick hard mask layer; and patterning the thin mask layer using the patterned photoresist layer and the residual thick mask layer as etching mask.

4. The method of claim 2, wherein the etching selectivity ratio of the thick mask layer to the thin mask layer is greater than 1.

5. The method of claim 2, wherein the etching selectivity ratio of the thin mask layer to the material layer is greater than 10.

6. The method of claim 4, wherein the thick mask layer includes a silicon nitride layer.

7. The method of claim 4, wherein the thin mask layer includes a silicon oxide layer.

8. The method of claim 5, wherein the material layer includes a polysilicon layer.

9. The method of claim 1, wherein after the micro-trenches are formed, an additional isotropic etching step is conducted to regulate the width of the micro-trenches.

10. A method of forming a patterned mask for reducing pattern pitch, comprising the steps of:

forming a mask layer over a substrate;

forming a patterned photoresist layer over the mask layer;

etching the mask layer using the patterned photoresist layer as etching mask, wherein a residual mask layer remains in an exposed region and a plurality of micro-trenches are formed at the edges of the residual mask layer in the exposed region; and removing the patterned photoresist layer.

11. The method of claim 10, wherein the mask layer includes a silicon nitride layer.

12. The method of claim, 10, wherein the mask layer includes a silicon oxide layer.

13. The method of claim 10, wherein the step of forming the mask layer over the substrate includes the sub-steps of:

forming a thin mask layer over the substrate; and forming a thick mask layer over the thin mask layer.

14. The method or claim 13, wherein the step of etching the mask layer using the patterned photoresist layer as etching mask includes the sub-steps of:

etching the thick mask layer using the patterned photoresist layer as etching mask, wherein due to the trenching effect, a residual thick mask layer remains in the exposed region and the micro-trenches are formed in the thick mask layer; and patterning the thin mask layer using the patterned photoresist layer and the residual thick mask layer as etching mask.

15. The method of claim 13, wherein the etching selectivity ratio of the thick mask layer to the thin mask layer is greater than 1.

16. The method of claim 15, wherein the thick mask layer includes a silicon nitride layer.

17. The method of claim 15, wherein the thin mask layer includes a silicon oxide layer.

18. The method of claim 10, wherein after the micro-trenches are formed, an additional isotropic etching step is conducted to regulate the width of the micro-trenches.

19. A method of reducing pattern pitch on a substrate, comprising the steps of:

forming a material layer over the substrate;

forming a patterned mask layer on the material layer to expose a region;

performing an etching process by using the patterned mask layer as etching mask for forming micro-trenches in the material layer, wherein a residual material layer remains in the exposed region and the micro-trenches are formed along sidewalls of the patterned mask layer; and removing the patterned mask layer.

20. The method of claim 19, wherein the etching process comprises a reactive ion etching process.

21. The method of claim 20, wherein the bias power of the reactive ion etching process is lower than 150 W, and the source bias power is higher than 500 W.

22. The method of claim 20, wherein the reactive gas of the reactive ion etching process comprises chlorine when the material layer is a polysilicon layer and the patterned mask layer is a silicon oxide layer.

* * * * *